US010838806B2

(12) United States Patent
Lin et al.

(10) Patent No.: US 10,838,806 B2
(45) Date of Patent: Nov. 17, 2020

(54) SOLID STATE STORAGE SYSTEM WITH LATENCY MANAGEMENT MECHANISM AND METHOD OF OPERATION THEREOF

(71) Applicant: SMART Modular Technologies, Inc., Newark, CA (US)

(72) Inventors: Fong-Long Lin, Fremont, CA (US); Shu-Cheng Lin, Taipei (TW)

(73) Assignee: SMART Modular Technologies, Inc., Newark, CA (US)

( * ) Notice: Subject to any disclaimer, the term of this patent is extended or adjusted under 35 U.S.C. 154(b) by 61 days.

(21) Appl. No.: 15/955,566

(22) Filed: Apr. 17, 2018

(65) Prior Publication Data

US 2018/0232159 A1 Aug. 16, 2018

Related U.S. Application Data

(63) Continuation of application No. 15/076,433, filed on Mar. 21, 2016, now Pat. No. 9,946,469.

(51) Int. Cl.
*G06F 11/10* (2006.01)
*G11C 16/34* (2006.01)
*G11C 16/04* (2006.01)

(52) U.S. Cl.
CPC ...... *G06F 11/1044* (2013.01); *G11C 16/3427* (2013.01); *G11C 16/0483* (2013.01)

(58) Field of Classification Search
None
See application file for complete search history.

(56) References Cited

U.S. PATENT DOCUMENTS

| 6,023,746 | A | 2/2000 | Arimilli et al. |
| 6,385,071 | B1 | 5/2002 | Chai et al. |
| 7,818,525 | B1 * | 10/2010 | Frost ............... G06F 12/0246 365/185.25 |
| 8,560,759 | B1 * | 10/2013 | Boyle ............... G06F 12/0246 711/101 |
| 9,075,754 | B1 | 7/2015 | Sadhu |
| 2008/0320227 | A1 | 12/2008 | Miura et al. |
| 2011/0066793 | A1 | 3/2011 | Burd |
| 2013/0086300 | A1 * | 4/2013 | Luca ............... G06F 11/1064 711/102 |
| 2013/0132638 | A1 | 5/2013 | Horn et al. |

(Continued)

OTHER PUBLICATIONS

U.S. Appl. No. 15/076,433, Non-Final Office Action dated Jun. 15, 2017.

(Continued)

*Primary Examiner* — Yolanda L Wilson
(74) *Attorney, Agent, or Firm* — Wong & Rees LLP (57) ABSTRACT

A solid state storage system, and method of operation thereof, including: a system interface configured to receive host commands; a controller, coupled to the system interface, configured to identify frequently read data blocks from the host commands; a non-volatile memory, coupled to the controller, configured for access of the frequently read data blocks; an error correction code unit, coupled to the controller, configured to provide health monitor parameters for the frequently read data blocks verified by the controller; and a redundant frequently read data (RFRD) area, coupled to the error correction code unit, configured to transfer a recovered data from the frequently read data blocks.

20 Claims, 9 Drawing Sheets

(56) References Cited

U.S. PATENT DOCUMENTS

| | | |
|---|---|---|
| 2013/0322169 A1 | 12/2013 | Goss et al. |
| 2014/0237265 A1* | 8/2014 | Mothilal ............. G06F 12/0246 713/193 |
| 2014/0281160 A1* | 9/2014 | Suzuki ................ G06F 12/0246 711/103 |
| 2015/0089278 A1 | 3/2015 | Patapoutian et al. |
| 2015/0154066 A1 | 6/2015 | Grimsrud et al. |
| 2015/0227418 A1* | 8/2015 | Cai ..................... G06F 11/1048 714/768 |
| 2016/0026575 A1 | 1/2016 | Samanta et al. |
| 2017/0269852 A1* | 9/2017 | Lin .................... G11C 16/3427 |

OTHER PUBLICATIONS

U.S. Appl. No. 15/076,433, Notice of Allowance dated Dec. 14, 2017.
World Intellectual Property Organization, Application No. PCT/US17/22608, International Search Report dated Aug. 7, 2017.
World Intellectual Property Organization, Application No. PCT/US17/22608, Pending Claims as of Aug. 7, 2017.

* cited by examiner

SOLID STATE STORAGE SYSTEM WITH LATENCY MANAGEMENT MECHANISM AND METHOD OF OPERATION THEREOF

CROSS REFERENCE TO RELATED APPLICATIONS AND PRIORITY CLAIM

This application claims benefit as a Continuation of U.S. patent application Ser. No. 15/076,433, filed Mar. 21, 2016. The entire contents of which is hereby incorporated by reference for all purposes as if fully set forth herein, under 35 U.S.C. § 120.

TECHNICAL FIELD

The present invention relates generally to a non-volatile memory storage system, and more particularly to a system for accessing a non-volatile memory storage system with latency management.

BACKGROUND ART

Some applications require constant high read performance, fixed read latency, and millions of read operations during the operating time. Most storage system controllers can maintain a read cache in volatile memory in order to satisfy the latency requirements of most applications. A typical volatile memory cache can be 1-10 megabytes (MB) in size. Some high demand applications can require more than 8 gigabytes (GB) for a series of images that are repeatedly accessed making the volatile memory cache ineffective.

With the advance of non-volatile memory (e.g., flash memory), some attempts have been made to use non-volatile memory as the storage media of choice. Performance limitations, of the non-volatile memory, have prevented its use as primary storage memory. Repeated reads of the same records from non-volatile memory can deplete the charge in the memory cells and corrupt the data stored in the cells. Data recovery through error correction processes can add precious latency to the availability of the data.

Attempts to solve these problems at the card or subassembly level have employed expensive additions of hardware that can render the product too expensive for the application. Some applications can require millions of reads of the same data blocks over an operational period that would severely limit or eliminate normal data management processes.

Thus, a need still remains for a solid state storage system with latency management mechanism that can provide enhanced performance and longevity of a non-volatile storage system. In view of the growing market in the personal and commercial entertainment systems, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a solid state storage system including: receiving host commands; identifying frequently read data blocks from the host commands; reading the frequently read data blocks from a non-volatile memory; verifying health monitor parameters for the frequently read data blocks; and transferring recovered data from the frequently read data blocks.

The present invention provides a solid state storage system, including: a system interface configured to receive host commands; a controller, coupled to the system interface, configured to identify frequently read data blocks from the host commands; a non-volatile memory, coupled to the controller, configured for access of the frequently read data blocks; an error correction code unit, coupled to the controller, configured to provide health monitor parameters for the frequently read data blocks verified by the controller; and a redundant frequently read data (RFRD) area, coupled to the error correction code unit, configured to transfer a recovered data from the frequently read data blocks.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals.

For expository purposes, the term "horizontal" as used herein is defined as a plane parallel to the plane or active surface of the NAND flash memory die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "processing" as used herein includes the manipulation of data between a system source to a targeted memory element. The term "FIFO" is defined to be a first in first out storage element capable of multiple accesses or dual port operation. The integrated circuit carrier of the present invention is defined to be an integrated circuit package, a printed circuit board, a flex circuit, a dual in-line memory module, or the like. The integrated circuit carrier includes multiple memory types, such as volatile memory and non-volatile memory, coupled to a control circuit for moving data content between the multiple memory types and a package interface.

The term "random access memory (RAM)" as used in this application is defined to be a high-speed volatile memory that provides a temporary storage of data. The term "cache" is defined as a volatile memory storage element organized and supported by additional hardware to provide direct access to stored data held within the storage element.

Figure 1:
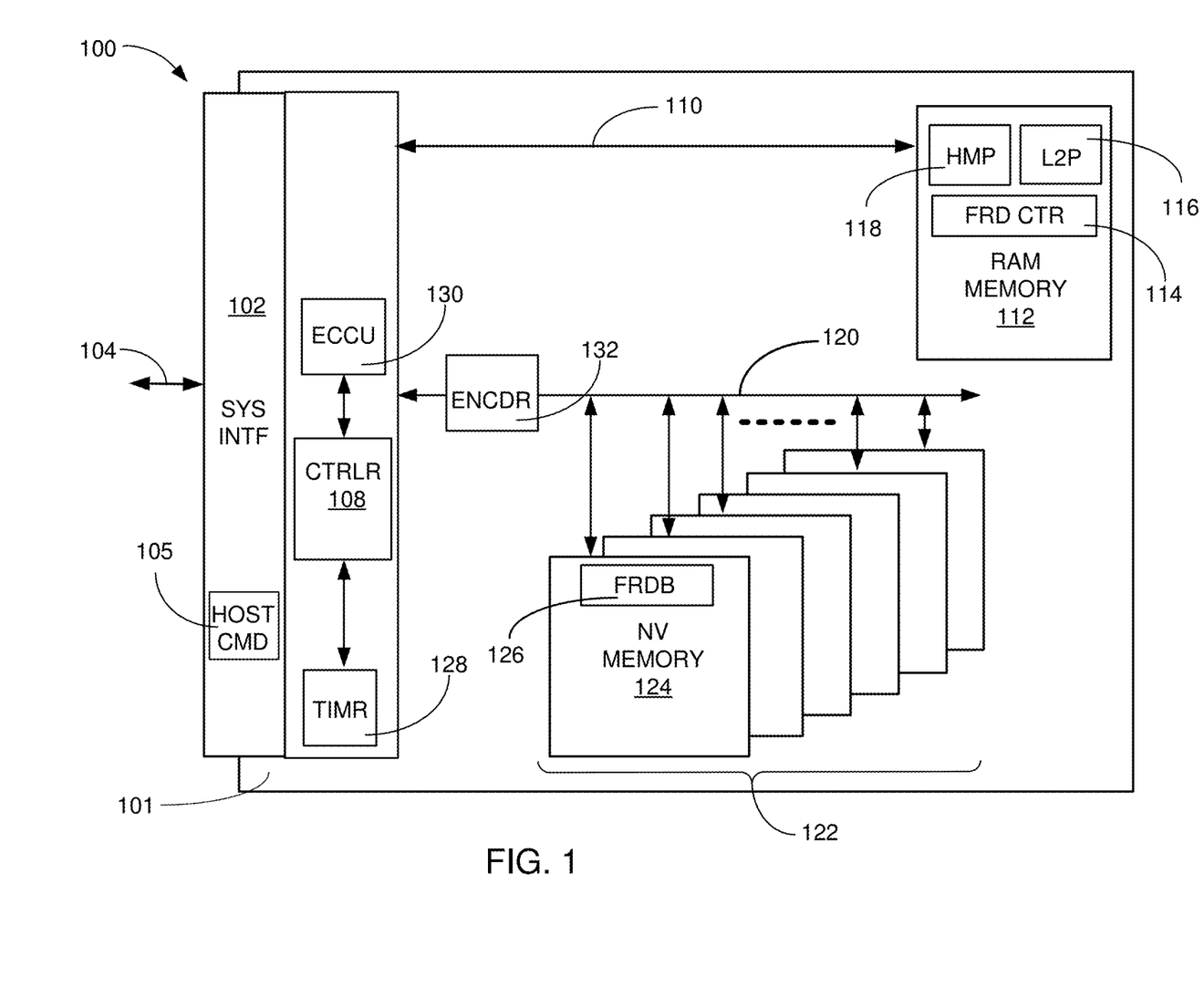
FIG. 1 is an example embodiment of a functional block diagram of a solid state storage system of the present invention.

Referring now to FIG. 1, therein is shown an example embodiment of a functional block diagram of a solid state storage system 100 of the present invention. The functional block diagram of the solid state storage system 100 depicts an integrated circuit carrier 101 with a system interface 102 having a system data and control bus 104, such as a bi-directional data interface. The system interface 102 can be a communication portal for receiving host commands 105, transferring data between the solid state storage system 100 and a host (not shown), or a combination thereof. The system interface 102 can include a peripheral computer interface express (PCI-e), Serial ATA (SATA), fiber channel (FC), small computer system interface (SCSI), or serial attached SCSI (SAS), and the host's memory channel interface.

The system interface 102 can be closely coupled to a controller 108, such as a solid state disk drive controller, a micro-controller, a micro-processor, or a micro-computer. The controller 108 can manage the transfers executed by the system interface 102. The controller 108 can analyze the host commands 105 received by the system interface 102, identify how to execute the host commands 105, and where to locate any data transferred by the system interface 102.

The controller 108 can also manage an internal interface data bus 110 for distribution of interface data within the solid state storage system 100. The internal interface data bus 110 can include control lines that manage the direction of movement and timing of data transferred between the controller 108 and a RAM memory 112. The RAM memory 112 can be a volatile memory structure used by the controller 108 for storing pointers, tables, status, and the like. The controller 108 can store a frequently read data counter 114 in the RAM memory 112. The frequently read data counter 114 can monitor all of the data stored in the solid state storage system 100. The frequently read data counter 114 can be used to identify low latency data that is repeatedly read by the host. The controller 108 can store a logical-to-physical (L2P) table 116 in the RAM memory 112. The L2P table 116 can contain pointers identifying the physical location of data identified with a logical block address (LBA) by the host. The controller 108 can also store health monitor parameters (HMP) 118 for all frequently read data blocks 126 that is identified through the frequently read data counter 114. The HMP 118 can keep track of the condition of the frequently read data blocks 126 by logging the number of times the data has been read, the number of read retries, the number of correctable bit errors, and the number of uncorrectable bit errors that are located in the frequently read data blocks 126. All of the HMP 118 is maintained on an erase block level for the frequently read data blocks 126. It is understood that the system interface 102, the controller 108, a timer 128, an error correction code unit (ECCU) 130, the internal interface data bus 110, a data encoder 132, the RAM memory 112 can be fabricated on a die or as a multi-chip package.

The controller 108 can also manage a storage bus 120 used for transferring host data between the interface 102 and a storage array 122 of non-volatile memory 124. The non-volatile memory 124 can be Flash memory, magnetic random access memory (MRAM), Resistive Random Access Memory (RRAM), or Phase Change Memory (PCM). The non-volatile memory 124 can be configured to store and retrieve the frequently read data blocks 126 with low latency. This can be useful if the frequently read data blocks 126, that is retrieved, contains graphic display data. In this type of application the timely retrieval of the frequently read data blocks 126 can be critical to prevent flicker or missed frames of the graphic data. In order to determine whether the host commands 105 are to retrieve the frequently read data blocks 126, the controller 108 can use the timer 128 to determine the time interval between requests for the frequently read data blocks 126.

The non-volatile memory 124 can be susceptible to read disturb of the stored data, when a nearby page of the data is read. The read disturb can change the electrical charge in a floating gate of a memory cell and thereby corrupt the data stored in the cell. The controller 108 can correct some degree of the corruption of the frequently read data blocks 126 by activating the ECCU 130 to process the corrupted data read from the non-volatile memory 124.

The controller 108 can include the data encoder 132 that can process the host data received from the system interface 102 and is sent to the storage bus 120. The data encoder 132 can be a hardware unit that converts the incoming bit sequence to an outgoing bit sequence. The data encoder 132 can help preserve the data integrity of the frequently read data blocks 126 by making the memory cells of the non-volatile memory 124 less likely to be corrupted by read disturbs.

During normal operation, the controller 108 can execute a background process in order to maintain the non-volatile memory 124. The background process can include refreshing the data, static wear-leveling, garbage collection of discarded and valid data in the non-volatile memory 124. The background processes can consume a portion of the bandwidth of the controller 108 and induce latency in responding to the system interface 102. The operation of the background process is essential to the integrity of the host data stored in the non-volatile memory 124.

In order to maintain the performance of the system interface 102, during periods of intense activity, the controller 108 can pause the background process. The controller 108 can defer the background processes until a maintenance period is allowed. It is understood that in some applications of the solid state storage system 100, the frequently read data blocks 126 can be accessed millions of times which would be far beyond the ability of the non-volatile memory 124 to maintain data integrity is the cells holding the frequently read data blocks 126.

In an embodiment, in order to maintain the integrity of the frequently read data blocks 126, the controller 108 can monitor the non-volatile memory 124 and the frequently read data blocks 126 and store in the HMP 118 to anticipate the failure of the frequently read data blocks 126. In anticipation of such a failure, the controller 108 can generate redundant copies of the frequently read data blocks 126 in a separate area of the storage array 122. The management of the frequently read data blocks 126 without adding additional latency is a key aspect of the controller 108. The controller 108 can add links in the L2P table 116 indicating there are additional copies of a selected logical block available in the storage array 122. The controller 108 can monitor the HMP 118 for the selected logical block in order to determine whether to read the current location of the selected logical block or access a linked copy of the selected logical block in order to eliminate any additional latency that could be caused by the condition of the frequently read data blocks 126, for example, lengthy error correction, multiple read retries, etc.

The controller 108 can initialize the HMP 118 for each of the logical blocks written by the host. As the data of the logical block is accessed and the condition of the data deteriorates, the controller 108 can read error correction status from the ECCU 130 in order to adjust the HMP 118. The controller 108 can establish a threshold of the HMP 118 that can enable a switch to reading a linked location of the frequently read data blocks 126. It is understood that the repeated reading of the frequently read data blocks 126 can change the charge in the floating gate of the storage cells in the non-volatile memory 124. While the deterioration of the various locations in the non-volatile memory 124 cannot be accurately predicted, the controller 108 can use the HMP 118 as a key indication of the eventual collapse of the data integrity. This knowledge can allow a switch to a new copy of the frequently read data blocks 126 without waiting to resolve data integrity issues in the current location of the frequently read data blocks 126, for example, the data integrity issues can cause read retry or take more time to recover error bits.

It has been discovered that the use of the RAM memory 112 even configured as a caching structure cannot provide sufficient write/read capacity for the solid state storage system 100 to hold all of the frequently read data blocks 126. The read execution time of the solid state storage system 100, through the monitoring of the HMP 118 and the frequently read data counter 114, can reduce additional latency in transferring the frequently read data blocks 126, while maintaining the data integrity without the execution of background processes, such as static wear-leveling, data refresh and garbage collection.

Figure 2:
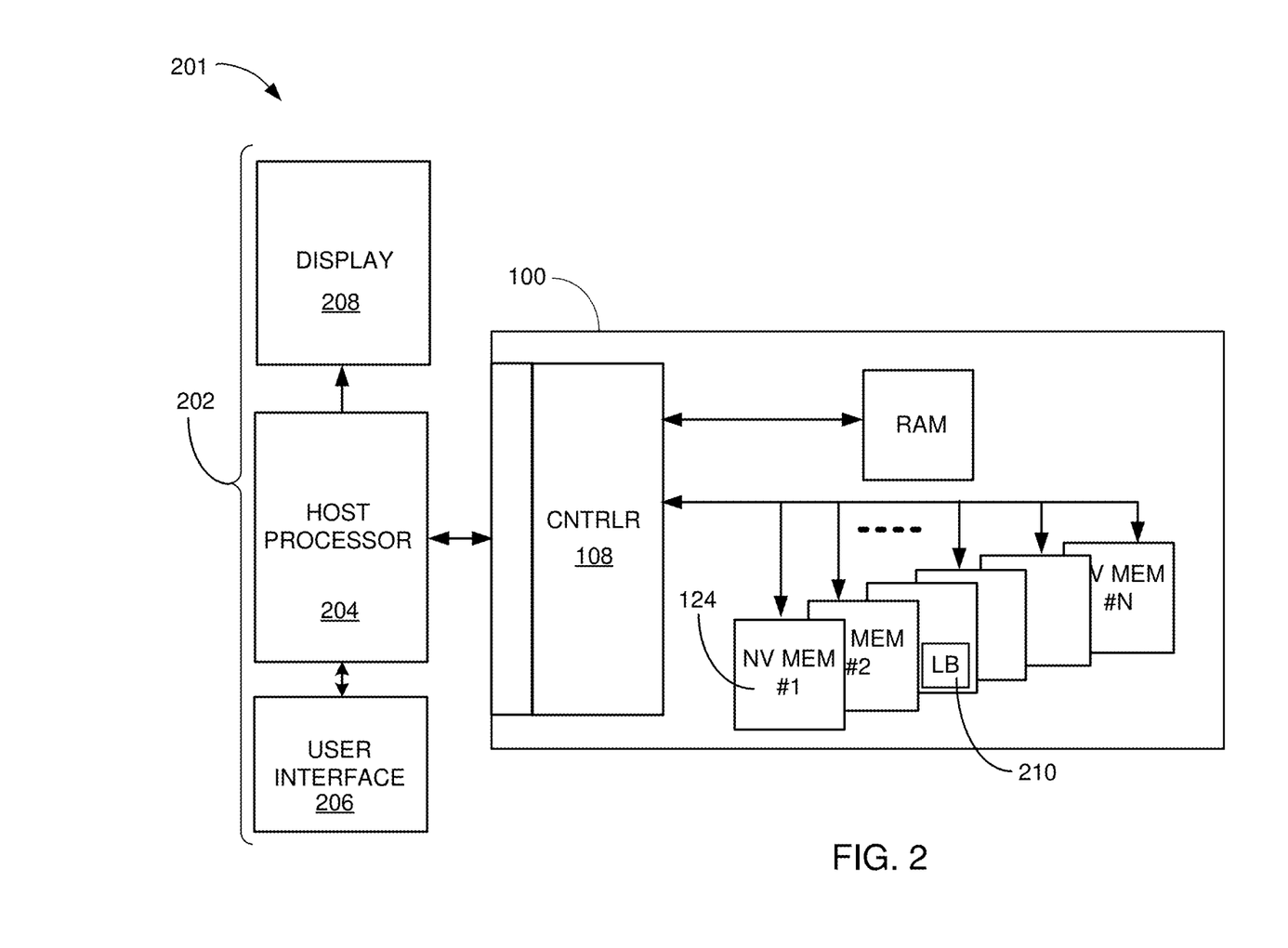
FIG. 2 is an example embodiment of a functional block diagram of an application of the solid state storage system of FIG. 1.

Referring now to FIG. 2, therein is shown an example embodiment of a functional block diagram of an application 201 of the solid state storage system 100. The functional block diagram of the application 201 depicts a user system 202 including a host processor 204, a user interface 206, and a display 208. The user system 202 can be a video game console, a training platform, a test station, or an interactive gaming console, such as a Pachinko machine. When the host processor 204 writes logical blocks 210 to the solid state storage system 100, the controller 108 can distribute the logical blocks across a plurality of erase blocks within the non-volatile memory 124.

During the execution of the user system 202, the host processor 204 can read specific ones of the logical blocks 210 from the solid state storage system 100. The controller 108 can monitor the accesses of the logical blocks 210 in order to determine whether the logical blocks 210 are the frequently read data blocks 126 of FIG. 1. The controller 108 can set a threshold based on the number of reads that occur within a limited time, as measured by the timer 128 of FIG. 1 or a raw count of the read accesses of the logical blocks 210. During each read access performed by the host processor 204, the controller 108 can adjust the frequently read data counter 114 of FIG. 1 and the HMP 118 of FIG. 1. The controller 108 can determine the logical blocks 210 are indeed the frequently read data blocks 126 and take appropriate action to assure low latency accesses for the logical blocks 210.

The host processor 204 can read the logical blocks 210 directly from the solid state storage system 100 for presentation on the display 208. The next access of the logical blocks 210 can be dependent on input from the user interface 206. The host processor 204 can respond to the user interface 206 by reading the appropriate set of the logical blocks 210 from the solid state storage system 100. It is imperative that the solid state storage system 100 transfer the logical blocks 210 with minimum latency, so that no lag is detected by the user and no flicker is evident in the display 208. This type of heavy interaction between the user interface 206 and the display 208 can put extreme stress on the solid state storage system 100.

When the controller 108 determines the host processor 204 is accessing the frequently read data blocks 126, extra monitoring can be performed and redundant copies of the logical blocks 210 can be generated. The number of copies of the logical blocks 210 and their location can be determined by the controller 108 by checking the timing of accessing the logical blocks 210 by sampling the timer 128. As it is determined that additional copies of the logical blocks 210 are required, the controller 108 can create additional copies and add links in the L2P table 116 from the original location of the series of the copies. The controller 108 can use different strategies to position the copies of the logical blocks 210 in different regions of the non-volatile memory 124 to prevent read disruptions from reading adjacent data. The read disruptions can change the charge in the floating gate of the memory cell in the non-volatile memory 124.

It is understood that the user system 202 can operate continuously for 8 to 16 hours with no break in the intensity of the reading of the frequently read data blocks 126. During that duration the controller 108 can maintain the low latency transfers to the host processor 204 by keeping the background process paused and generate additional copies of the frequently read data blocks 126 as required.

It has been discovered that the solid state storage system 100 can support long durations of low latency transfers of the frequently read data blocks 126 while the background process is paused. In this example application, a limited amount of the capacity of the solid state storage system 100 can be dedicated to providing the additional copies of the logical blocks 210 as required to support the frequently read data blocks 126.

Figure 3:
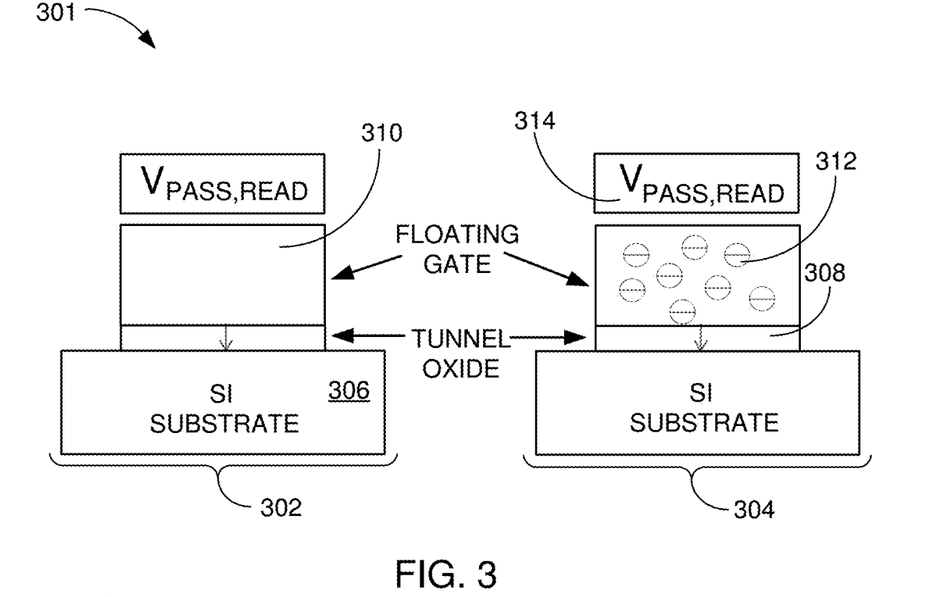
FIG. 3 is an architectural block diagram of a storage cell of the solid state storage system of FIG. 1.

Referring now to FIG. 3, therein is shown an architectural block diagram of a storage cell 301 of the solid state storage system of FIG. 1. The architectural block diagram of a storage cell 301 depicts a "1" state storage cell 302 and a "0" state storage cell 304. Each of the "1" state storage cell 302 and the "0" state storage cell 304 can be formed on a silicon substrate 306. It is understood that any of the storage cells 301 in the non-volatile memory 124 can be erased to be the "1" state storage cell 302 or programmed to be the "0" state storage cell 304.

A tunnel oxide 308 is formed on the silicon substrate 306. The tunnel oxide 308 supports a floating gate 310, which can be electrically charged or discharged in order to erase the "1" state storage cell 302 and program the "0" state storage cell 304. The "1" state storage cell 302 is shown reset to a "1" state and the "0" state storage cell 304 is shown programmed to a "0" state because it has captured a quantity of electrons 312. A contact 314, above the floating gate 310 can be set to a voltage level to allow a signal to pass through the silicon substrate 306 or allow the charged state of the floating gate 310 to determine whether the signal to pass through the silicon substrate 306.

It has been discovered that the "0" state storage cell 304 is a read disturb non-sensitive state storage cell 304 and is less susceptible to read disturb corruption and applies less stress to the tunnel oxide 308 during reads. It is the stress of the tunnel oxide 308 that can allow electrons 312 to leak into the floating gate 310. Over time the electrons in the floating gate 310 will exceed the expected amount and cause data integrity issue in the storage cell 301. The read disturb non-sensitive state storage cell 304 can reduce the potential for data errors due to electron migration.

Figure 4:
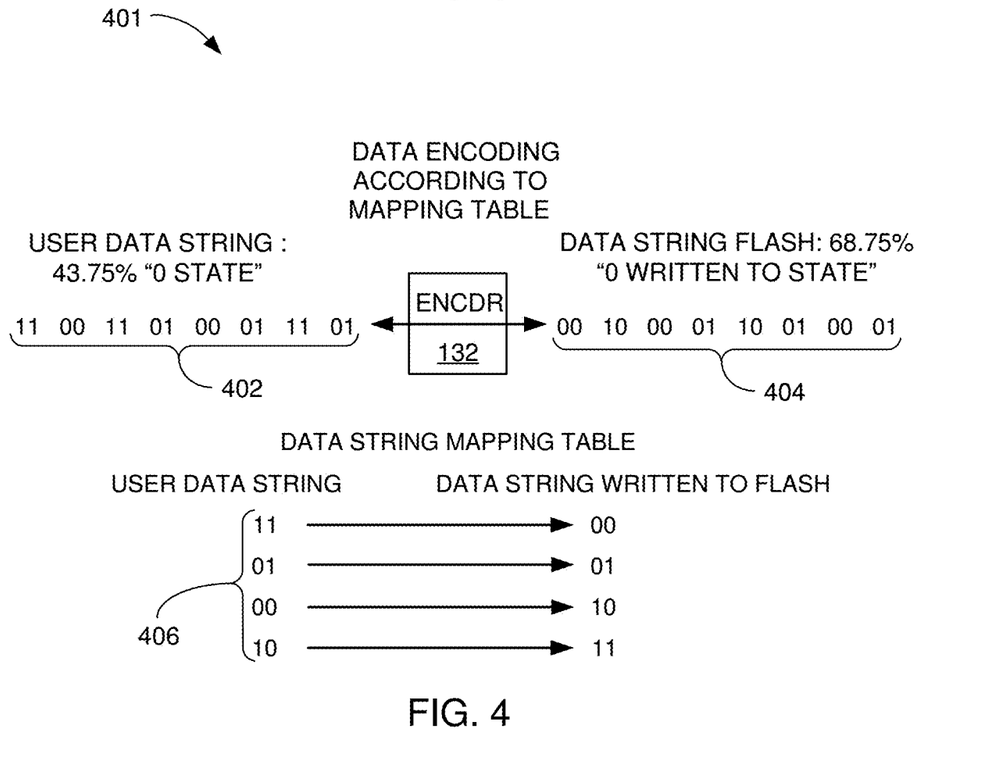
FIG. 4 is an example embodiment of data encoding system of the solid state storage system of FIG. 1.

Referring now to FIG. 4, therein is shown an example embodiment of data encoding system 401 of the solid state storage system 100 of FIG. 1. The example embodiment of the data encoding system 401 depicts a host input string 402 that can be passed through the data encoder 132 of FIG. 1 to produce a storage output string 404. It is understood that the data encoder 132 can also accept the storage output string 404 as read from the non-volatile memory 124 of FIG. 1 in order to produce the host input string 402 for transfer to the host processor 204 of FIG. 2 during a read operation.

The purpose of the encoder 132 is to provide a storage output string 404 that will be less susceptible to read disturb and therefore will maintain its data integrity for a longer term of operation. All of the data that is stored in the solid state storage system 100 is processed by the data encoder 132 at full data transfer bandwidth.

The data encoder 132 can operate on the basis that as the number of zeroes increases in a stored data structure, the more long term reliability that data structure will provide. As can be seen from the example provided, the host input string 401 can represent a 43.75% "0" state, while the storage output string 404 for that same data can represent a 68.75% "0" state. The change in percentage of the "0" state can significantly increase the ability longevity of the non-volatile memory 124 in view of the read disturb that can impact the frequently read data blocks 126 of FIG. 1.

In an example embodiment, the data encoder 132 can operate with a data mapping table 406 that can modify two bits at a time with the goal of increasing the number of "0" states in the data stream. It is understood that other embodiments are possible to achieve the goal of increasing the percentage of "0" states in the storage output string 404.

Figure 5:
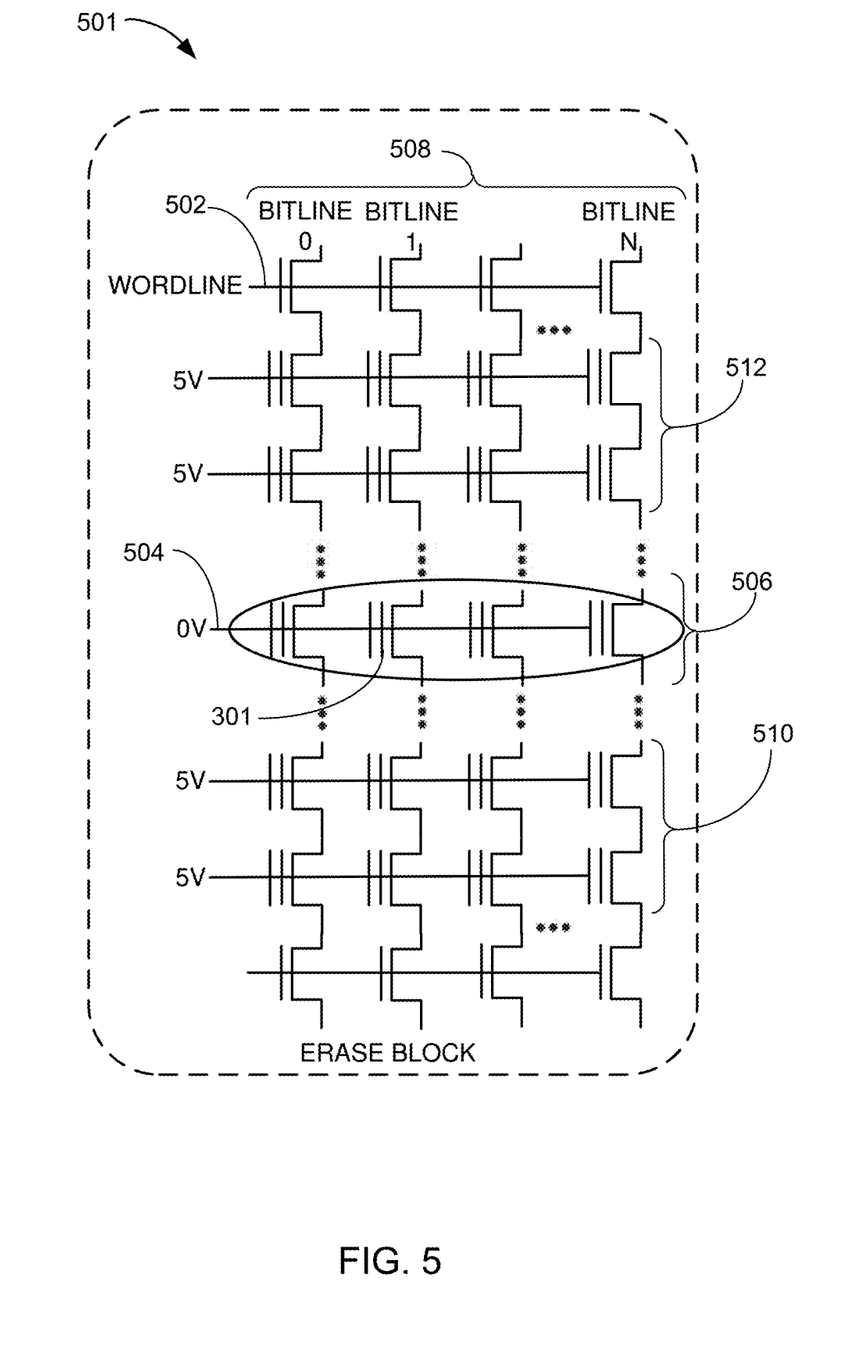
FIG. 5 is an example embodiment of an erase block of the solid state storage system.

Referring now to FIG. 5, therein is shown an example embodiment of an erase block 501 of the solid state storage system 100 of FIG. 1. The example embodiment of an erase block 501 represents the smallest erase block of common circuitry in the non-volatile memory 124. The erase block 501 is read by activating an enable line 502 and reducing a voltage on a pageline 504 for selecting a selected page 506. The value of each of the storage cell 301 in the selected page 506 is reflected in the bitline bus 508.

The pages not selected can be reflected as upstream pages 510 and downstream pages 512. The data values reflected on bitline 0 through bitline N of the bitline bus 508 can cause read disturb to occur in both the upstream pages 510 and the downstream pages 512. In the event the selected page 506 is part of the frequently read data blocks 126 of FIG. 1, the read disturb can severely impact the upstream pages 510 and the downstream pages 512. It is understood that the erase block 501 can include 128 pages or more and each of the selected page 506 can present between 4K and 64K bits on the bitline bus 508.

It has been discovered that the data encoder 132 can reduce the occurrence of read disturb in both the upstream pages 510 and the downstream pages 512. The controller 108 of FIG. 1 can distribute the frequently read data blocks 126 across several of the erase block 501. The distribution of the logical blocks 210 across separate ones of the erase block 501 can make certain that the logical blocks 210 cause less read disturb within the non-volatile memory 124.

Figure 6:
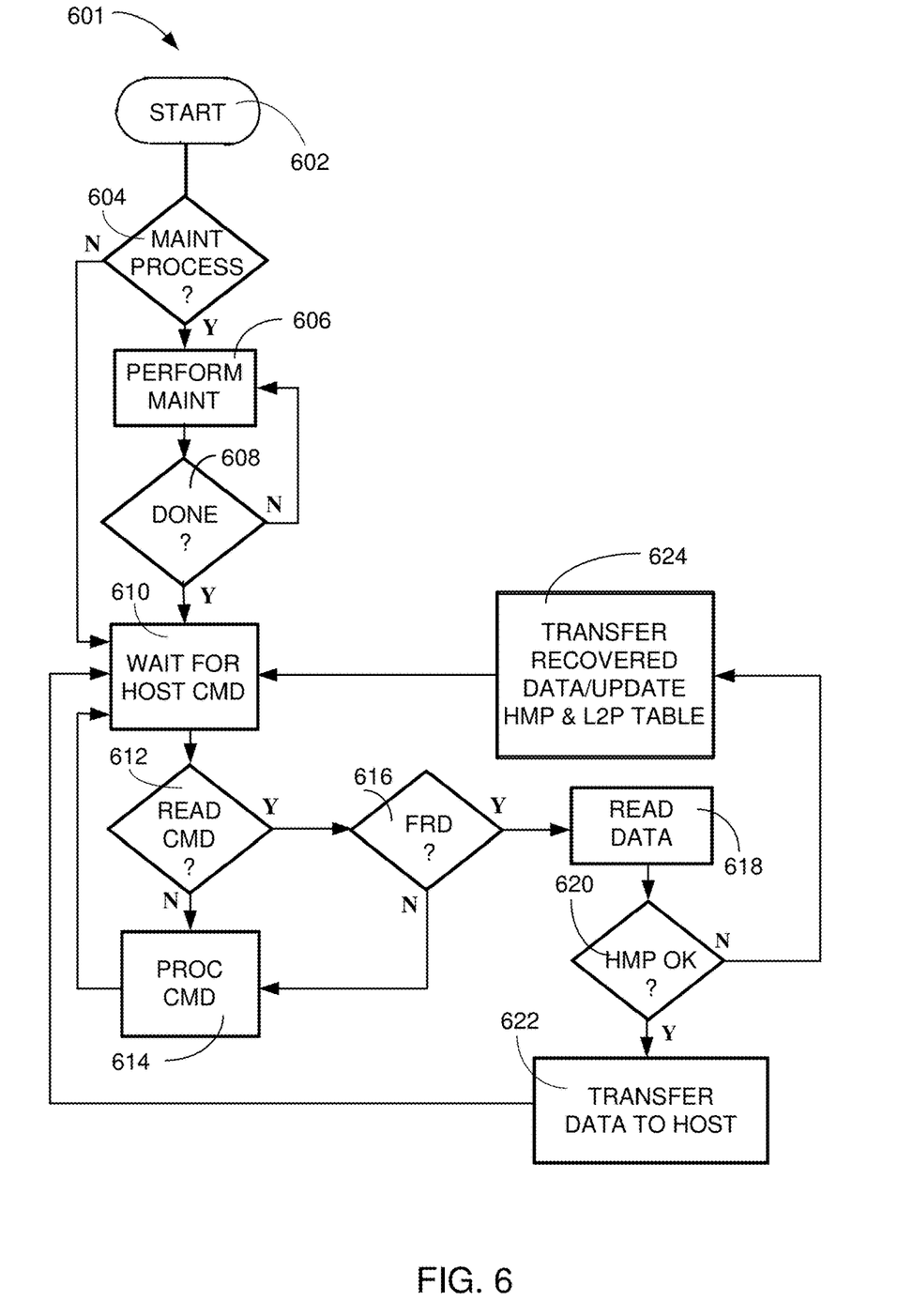
FIG. 6 is an example embodiment of an operational flow chart of the solid state storage system.

Referring now to FIG. 6, therein is shown an example embodiment of an operational flow chart 601 of the solid state storage system 100 of FIG. 1. The example embodiment of the operational flow chart 601 depicts a sequence start 602 that initiates the controller 108 of FIG. 1 to restore the frequently read data counter 114 of FIG. 1, the L2P table 116 of FIG. 1, and the HMP 118 of FIG. 1 in the RAM memory 112 of FIG. 1.

The flow proceeds to a check for maintenance period block 604. The controller 108 of FIG. 1 can set an indicator to show whether a maintenance period has been allowed. During periods of intense successive read host commands 105 of FIG. 1 issued from the host processor 204 of FIG. 2, the controller can set the indicator to not allow the maintenance period and disable background processes, like static wear-leveling, data refresh, garbage collection, bookkeeping, and capacity management, in order to minimize the read latency. The maintenance period can be allowed during power-up processing, during power-down processing, and during extended idle periods. The controller 108 can manage the timer 128 of FIG. 1 to provide an interrupt for idle time of the system interface 102 of FIG. 1 in order to initiate the maintenance period. The controller 108 can leave the maintenance mode and background processes enabled if the low latency read mode has not been activated. In an embodiment, the controller 108 can activate the low latency read mode after identifying the frequently read data blocks 126 of FIG. 1.

If the check for maintenance period block 604 detects that the maintenance mode is enabled, the flow proceeds to a perform maintenance block 606. The perform maintenance block 606 can execute the data refresh and garbage collection processes as a foreground process. If the host commands 105 are received through the system interface 102 of FIG. 1, the controller 108 can monitor the host commands 105 to determine whether the low latency mode should be activated. If the host commands 105 do activate the low latency mode, the controller 108 can disable maintenance mode and background process, clear the interrupt stack and return to the sequence start 602. If however the host commands 105 do not activate the low latency mode, the controller 108 can leave the maintenance mode in its current state and return to a check for maintenance done block 608. If the maintenance is not complete, the flow returns to the perform maintenance block 606 to continue the maintenance process.

When the perform maintenance block 606 has completed, the flow proceeds through the check for maintenance done block 608 to a wait for host command block 610. The flow can remain in the wait for host command block 610 until a host commands 105 are received. When the host commands 105 are received, the controller 108 can update the frequently read host data counter 114 of FIG. 1 and then the flow proceeds to a check for read command block 612. If the host commands 105 are not read commands, the flow proceeds to a process command block 614 to complete the host commands 105 that are pending before returning to the wait for host command block 610. If the host commands 105 are verified to be a read command, the flow proceeds to a check for frequently read host data block 616. If the read command is not addressed to the frequently read data blocks 126, the flow proceeds to the process command block 614 to complete the host commands 105 that are pending before returning to the wait for host command block 610.

If the read command is addressed to the frequently read data blocks 126, the flow proceeds to a read data block 618. The read data block 618 can access the frequently read data blocks 126 then proceed to a check health monitor parameter clock 620, in which the controller 108 can retrieve the data condition status from the ECCU 130 of FIG. 1 for determining the HMP 118 of FIG. 1. The controller 108 can update the HMP 118 in the RAM memory 112 of FIG. 1 in preparation for the host commands 105. If the frequently read data blocks 126 is correct the flow proceeds to a transfer data to host block 622, in which the frequently read host data is transferred to the host processor 204. The flow then proceeds to the wait for host command block 610.

If the frequently read data blocks 126 is not correct the flow proceeds to a transfer recovered data block 624. In the transfer recovered data block 624, the controller 108 can access the L2P table 116 in order to locate the next available copy of the frequently read data blocks 126. The controller 108 can update the L2P table 116 to indicate the copy is now the current image of the frequently read data blocks 126, read the frequently read data blocks 126, and update the HMP 118. The controller 108 then transfers the frequently read data blocks 126 to the host processor 204 and the flow then proceeds to the wait for host command block 610.

It has been discovered that the solid state storage system 100 can continue to meet the low latency requirement of the frequently read data blocks 126 for extended periods of time. The controller 108 can maintain additional copies of the frequently read data blocks 126 as required to maintain a low latency transfer of the frequently read data blocks 126 to the host processor 204. Also, the same methods can be applied to internal firmware data structure of the controller 108, for example, the L2P table 116 that are used to support the frequently read data blocks 126, and the firmware codes that are used to operate the controller 108.

Figure 7:
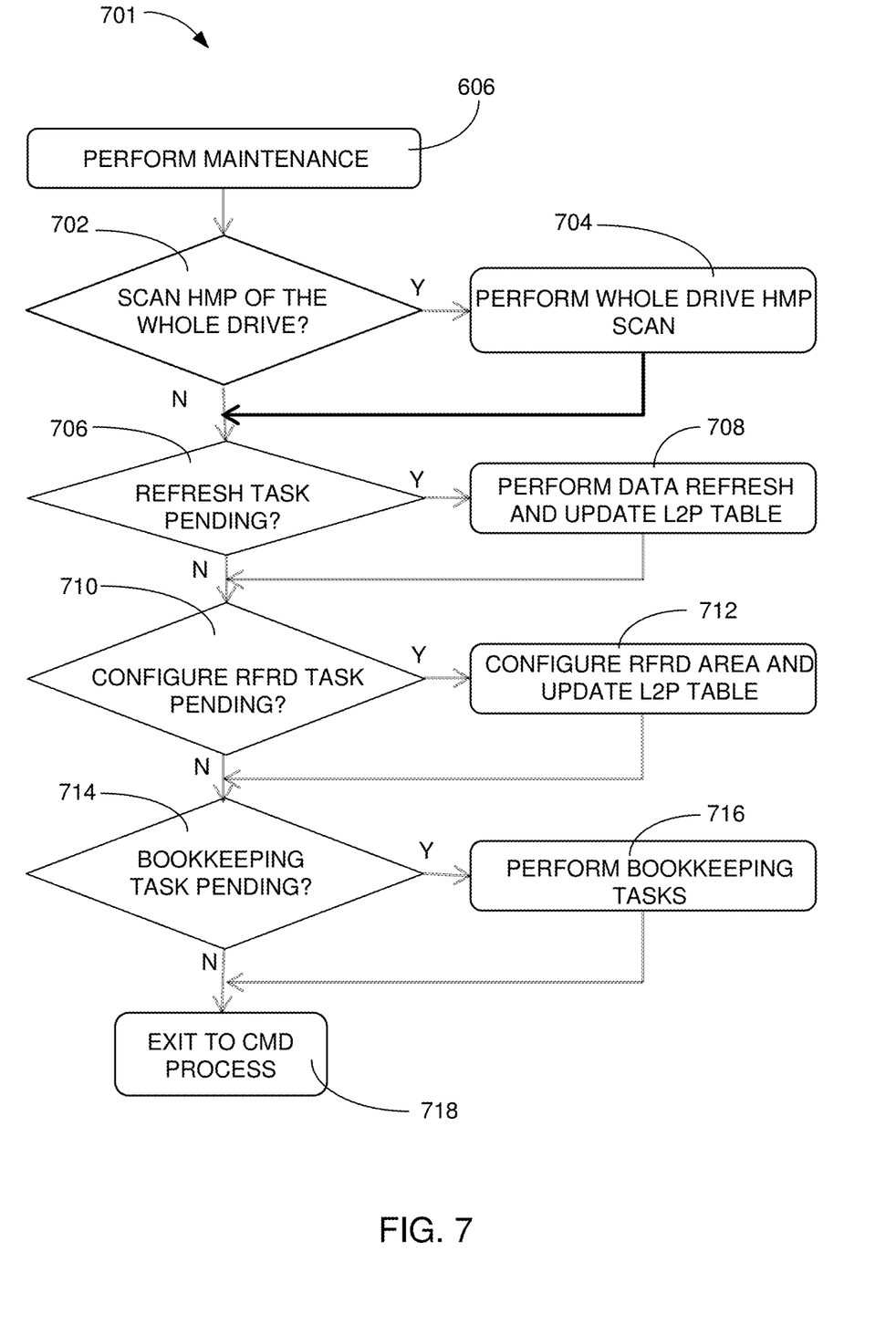
FIG. 7 is a flow chart of an example embodiment of a maintenance process of the solid state storage system.

Referring now to FIG. 7, therein is shown a flow chart of an example embodiment of a maintenance process 701 of the solid state storage system 100 of FIG. 1. The flow chart of the example embodiment of a maintenance process 701 depicts the perform maintenance block 606 as the entry for the maintenance process 701. The maintenance process 701 is executed in foreground by the controller 108 of FIG. 1, but is interruptible if the host commands 105 of FIG. 1 are received. The flow immediately proceeds to a scan HMP check 702, which scans the HMP table for abandoned copies of the frequently read data blocks 126 of FIG. 1 or current versions of the frequently read data blocks 126 that show poor indications in the health monitor parameters (HMP) 118 of FIG. 1. If the HMP 118 of the frequently read data blocks 126 indicates broad degradation, the flow proceeds to a perform whole drive HMP scan block 704. The perform whole drive HMP scan block 704 can monitor the HMP for each of the logical blocks 210 of FIG. 2 that were received from the host processor 204 of FIG. 2.

The flow then proceeds to a refresh task pending check block 706. The refresh task pending check block 706 can determine whether any of the logical blocks 210 that are due to have their data content re-written, the flow then proceeds to a perform data refresh block 708. The perform data refresh block 708 can refresh any of the logical blocks 210 that are due to be re-written. When all of the logical blocks 210 have been refreshed, the L2P table 116 is then updated to indicate the location of the refreshed versions of the logical blocks 210.

The flow proceeds to a redundant frequently read data (RFRD) check block 710. The redundant frequently read data (RFRD) check block 710 can monitor the frequently read data counter 114 of FIG. 1 in order to determine whether additional copies of the frequently read data blocks 126 should be generated.

The flow proceeds to a configure redundant frequently read data (RFRD) area block 712. The configure RFRD area block 712 can generate as many of the copies of the frequently read data blocks 126 as indicated by the frequently read data counter 114 and the number of available copies of the frequently read data blocks 126 that has not yet been accessed. The L2P table 116 is then updated to indicate the location of the refreshed versions of the frequently read data blocks 126. The update of the L2P table 116 can include links to the multiple copies of the logical blocks 210 that are copies of the frequently read data blocks 126.

The flow then proceeds to a bookkeeping pending check block 714. The bookkeeping pending check block 714 can read the L2P table 116 to determine if a garbage collection should be performed on the abandoned copied of the logical blocks 210 that are part of the frequently read data blocks 126. The flow then proceeds to a perform bookkeeping task block 716. In the perform bookkeeping task block 716, the controller 108 can perform a garbage collection process to remove the erase blocks 501 of FIG. 5 that can no longer store the logical blocks 210. When the garbage collection process has completed, the L2P table 116 can be updated to restore the capacity of the solid state storage system 100. The flow then proceeds to an exit block 718, which can alert the controller 108 that the maintenance process 701 has completed.

It has been discovered that the maintenance process 701 can allow the restoration of the solid state storage system 100 that has paused the background process for 8 to 16 hours, while incurring millions of read accesses of the frequently read data blocks 126 without incurring additional latency during the access of the frequently read data blocks 126. The maintenance process 701 can recover the logical blocks 210 from the erase blocks 501 that are recovered by the perform data refresh block 708 or scrapped by the garbage collection process of the perform bookkeeping task block 716.

Figure 8:
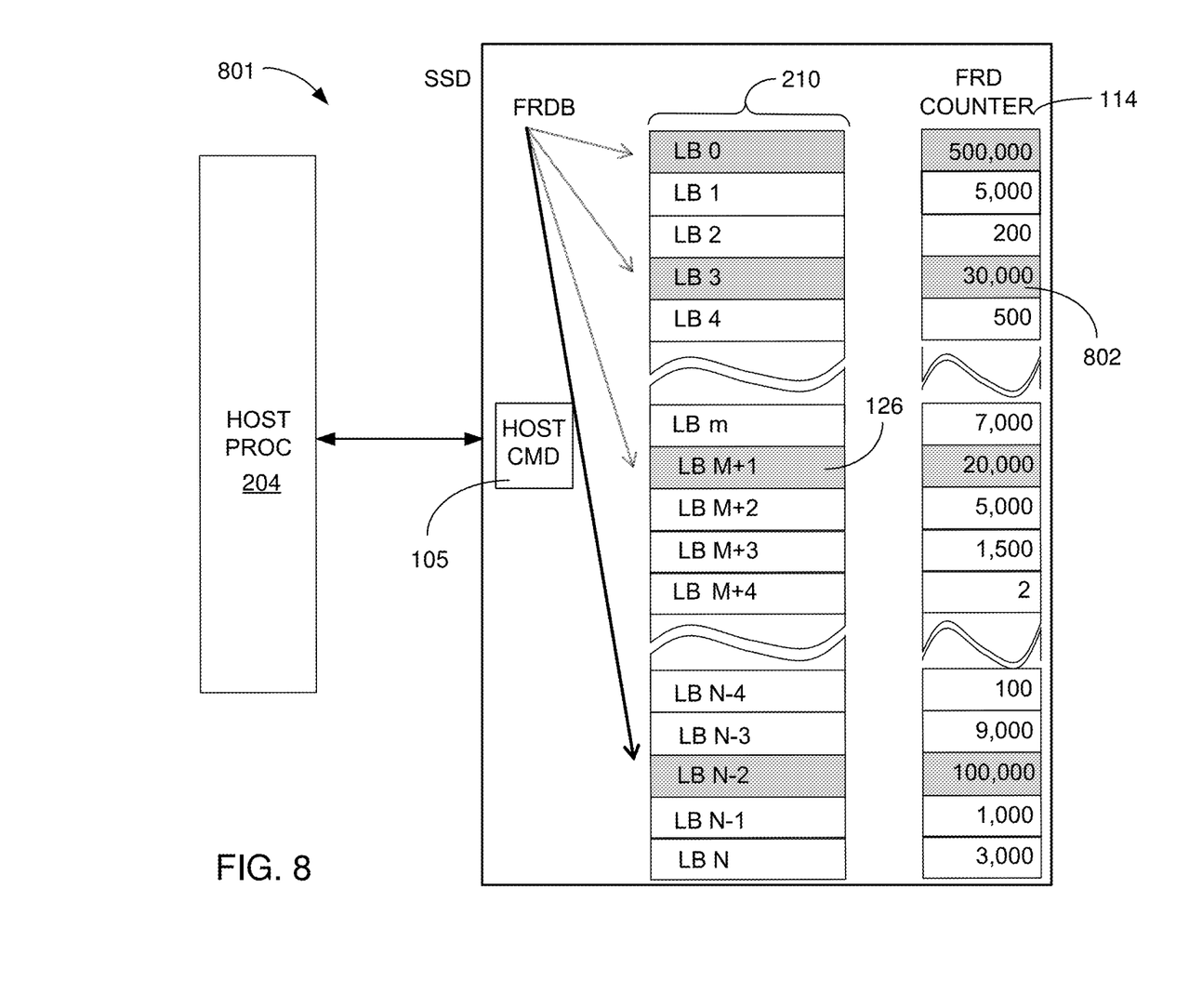
FIG. 8 is a functional block diagram of the identification of the frequently read host data by the frequently read data counter.

Referring now to FIG. 8, therein is shown a functional block diagram of the identification of the frequently read data blocks 126 by the frequently read data counter 114. The functional block diagram of the identification of the frequently read data blocks 126 by the frequently read data counter 114 depicts the host processor 204 that can issue the host commands 105 for accessing the logical blocks 210. The controller 108 of FIG. 1 can increment the frequently read data counter 114 for each of the logical blocks 210 that are accessed by the host commands 105.

The controller 108 can determine a threshold for determining the logical blocks 210 that are identified as the frequently read data blocks 126 and shaded in grey. By way of an example, the controller can utilize the timer 128 of FIG. 1 to determine the frequency of access of specific ones of the logical blocks 210 as well as the threshold of the access count 802. In this example, the threshold can be set to 10,000 accesses. Each of the different numbers of the access count 802 can cause the a different number of the copies of the logical blocks 210 to be copied to act as reserved copies of the frequently read data blocks 126. It is understood that the L2P table 116 of FIG. 1 can include the links to each of the logical blocks 210 designated as the frequently read data blocks 126.

Figure 9:
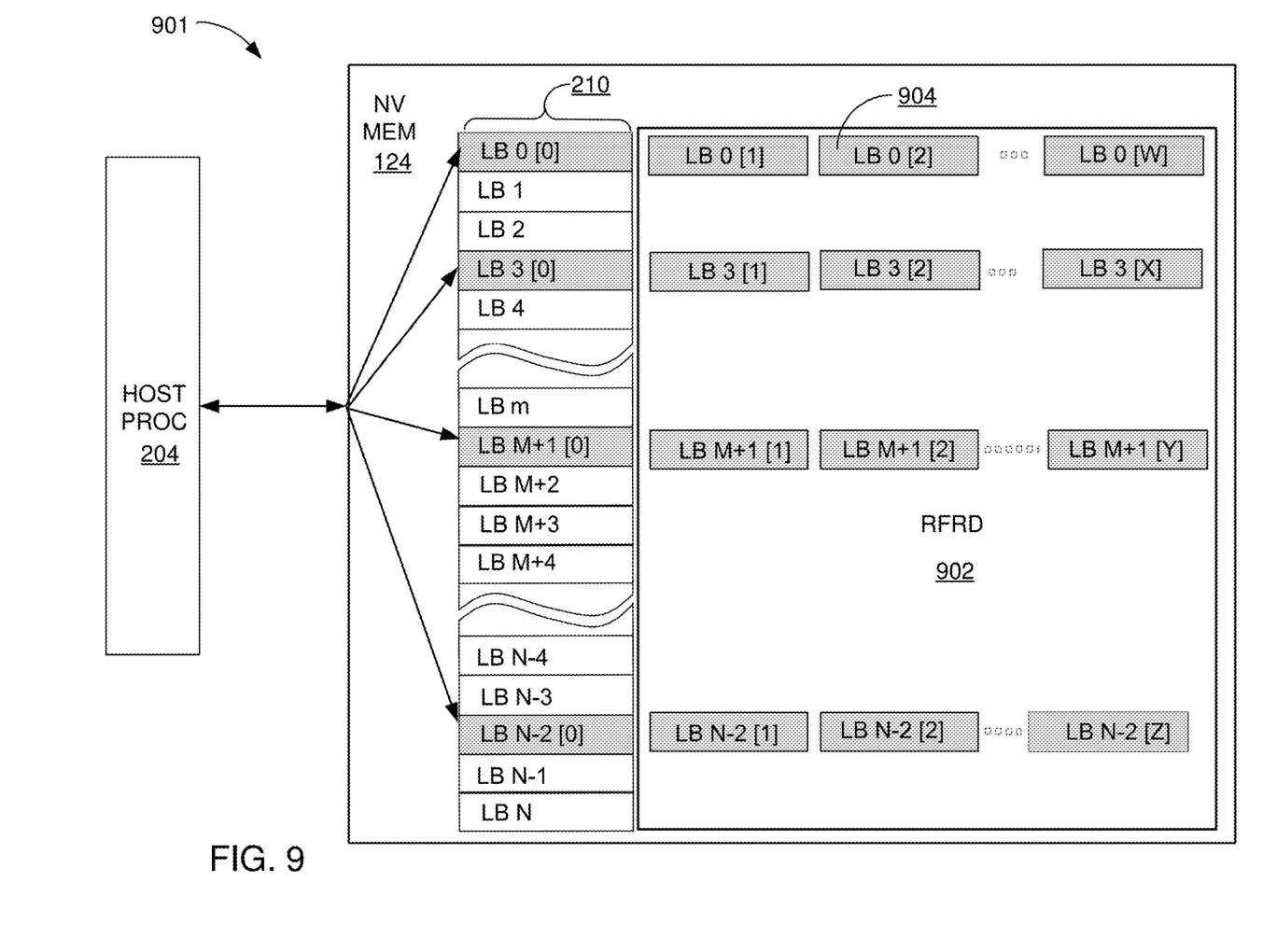
FIG. 9 is a functional block diagram of an embodiment of a redundant frequently read data (RFRD) area of the non-volatile memory.

Referring now to FIG. 9, therein is shown a functional block diagram of an embodiment 901 of a redundant frequently read data (RFRD) area 902 of the non-volatile memory 124. The functional block diagram of the embodiment 901 of the redundant frequently read data (RFRD) area 902 depicts the host processor 204 that has accessed the logical blocks 210 as required by the user application. Several of the logical blocks 210 can be identified as the frequently read data blocks 126. Based on the access count 802 of FIG. 8, the redundant frequently read data (RFRD) area 902 can be generated by copying the logical blocks 210 a number of times that would be commensurate with the access count 802 to form the reserved frequently read blocks 904.

In an embodiment, the reserved frequently read blocks 904 are limited to the specific ones of the logical blocks 210 designated as the frequently read data blocks 126. It is understood that the different number of the reserved frequently read blocks 904 is commensurate with the individual access count 802 for the frequently read data blocks 126. By producing the number of the reserved frequently read blocks 904 based on the access count 802, the solid state storage system 100 of FIG. 1 can maintain the low latency access to the frequently read data blocks 126 without operating the background process for 8 to 16 hours at a time before allowing the maintenance process 701 to refresh the data or perform garbage collection of the erase blocks 501 that cannot be salvaged.

In an alternative embodiment the controller 108 can make sufficient copies of all of the logical blocks 210 to satisfy the highest of the access count 802. It is understood that this embodiment would reduce the operating capacity of the solid state storage system 100, but the low latency access to any of the logical blocks 210 is always assured. In this embodiment the redundant frequently (RFRD) read data area 902 can significantly larger that the logical blocks 210 originally written by the host command 105 of FIG. 1.

It has been discovered that by distributing the logical blocks 210 across different erase blocks 501 and providing the data encoder 132 of FIG. 1, the integrity of the frequently read data blocks 126 can be extended. The reserved frequently read blocks 904 held in the redundant frequently read data (RFRD) area 902 can enable the solid state storage system 100 to operate in the low latency mode for 8 to 16 hours at a time without providing the background processed of data refresh or garbage collection until the maintenance process 701 is allowed by the controller 108. The controller 108 can enable the maintenance process 701 based on idle time of the system interface 102, a power-up process, or receiving a power-down command from the host processor 204.

Figure 10:
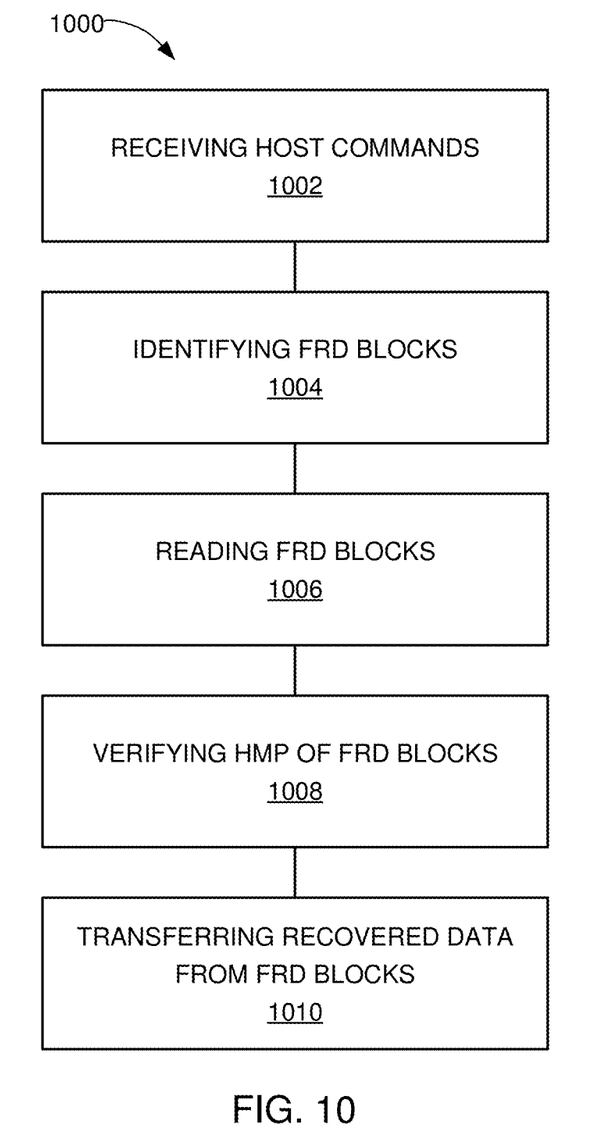
FIG. 10 is a flow chart of a method of operation of the solid state storage system in a further embodiment of the present invention.

Referring now to FIG. 10, therein is shown a flow chart of a method 1000 of operation of the solid state storage system 100 in a further embodiment of the present invention. The method 1000 includes: receiving host commands in a block 1002; identifying frequently read data blocks from the host commands in a block 1004; reading the frequently read data blocks from a non-volatile memory in a block 1006; verifying health monitor parameters for the frequently read data blocks in a block 1008; and transferring recovered data from the frequently read data blocks in a block 1010.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a solid state storage system comprising:
   receiving a host command from a host system;
      wherein the host command includes reading a data block in a non-volatile memory of the solid state storage system that is identified as a frequently read data block;
   reading the frequently read data block from the non-volatile memory and updating block health monitor parameters based on block usage of the non-volatile memory;
   comparing block health monitor parameters against a health threshold to determine a data condition status for the frequently read data block; and
   transferring data between the host system and one of a plurality of redundant copies of the frequently read data block on the non-volatile memory based on the data condition status.

2. The method as claimed in claim 1 further comprising encoding logical blocks from the host command for increasing a number of a read disturb non-sensitive state storage cell in the non-volatile memory.

3. The method as claimed in claim 1 wherein comparing the block health monitor parameters against a health threshold includes copying the frequently read data block to a plurality of reserved frequently read data blocks.

4. The method as claimed in claim 1 wherein transferring the data including reading reserved frequently read blocks.

5. The method as claimed in claim 1 further comprising creating a plurality of reserved frequently read blocks based on an access count.

6. The method as claimed in claim 1 further comprising encoding logical blocks from the host command for increasing a number of a read disturb non-sensitive state storage cell in the non-volatile memory including accessing a data mapping table.

7. The method as claimed in claim 1 further comprising creating a plurality of reserved frequently read blocks based on an access count including determining a timing of the access count.

8. One or more non-transitory computer-readable media storing instructions that, when executed by one or more computing devices, cause:
  receiving a host command from a host system;
    wherein the host command includes reading a data block in a non-volatile memory of the solid state storage system that is identified as a frequently read data block;
  reading the frequently read data block from the non-volatile memory and updating block health monitor parameters based on block usage of the non-volatile memory;
  comparing block health monitor parameters against a health threshold to determine a data condition status for the frequently read data block; and
  transferring data between the host system and one of a plurality of redundant copies of the frequently read data block on the non-volatile memory based on the data condition status.

9. The non-transitory computer-readable media of claim 8 further comprising encoding logical blocks from the host command for increasing a number of a read disturb non-sensitive state storage cell in the non-volatile memory.

10. The non-transitory computer-readable media of claim 8 wherein comparing the block health monitor parameters against a health threshold includes copying the frequently read data block to a plurality of the reserved frequently read data blocks.

11. The non-transitory computer-readable media of claim 8 wherein transferring the data including transferring reserved frequently read blocks.

12. The non-transitory computer-readable media of claim 8 further comprising creating a plurality of reserved frequently read blocks based on an access count.

13. The non-transitory computer-readable media of claim 8 further comprising encoding logical blocks from the host command for increasing a number of a read disturb non-sensitive state storage cell in the non-volatile memory including accessing a data mapping table.

14. The non-transitory computer-readable media of claim 8 further comprising creating a plurality of reserved frequently read blocks based on an access count including determining a timing of the access count.

15. A solid state storage system comprising:
  a system interface configured to receive a host command from a host system;
  a controller, coupled to the system interface, configured to execute the host command wherein the host command includes reading a data block in a non-volatile memory of the solid state storage system that is identified as a frequently read data block;
  a non-volatile memory, coupled to the controller, configured for access of the frequently read data block;
  an error correction code unit, coupled to the controller, configured to update block health monitor parameters of the frequently read data block based on block usage of the non-volatile memory for comparing against a health threshold to determine a data condition status for the frequently read data block; and
  a redundant frequently read data (RFRD) area, coupled to the error correction code unit, configured to transfer data between the host system and one of a plurality of redundant copies of the frequently read data block on the non-volatile memory based on the data condition status.

16. The system as claimed in claim 15 further comprising an encoder, coupled to the system interface, configured to encode logical blocks from the host command to increase a number of a read disturb non-sensitive state storage cell in the non-volatile memory.

17. The system as claimed in claim 15 wherein comparing the block health monitor parameters against a health threshold includes copying the frequently read data block to a plurality of the reserved frequently read data blocks.

18. The system as claimed in claim 15 wherein the controller is configured to read the block health monitor parameters and transfer the data including a reserved frequently read blocks transferred based on the block health monitor parameters.

19. The system as claimed in claim 15 wherein the redundant frequently read data (RFRD) area in a storage array configured to store a plurality of reserved frequently read blocks based on an access count.

20. The system as claimed in claim 15 further comprising an encoder, coupled to the system interface, configured to encode logical blocks from the host command to increase a number of a read disturb non-sensitive state storage cell in the non-volatile memory and the encoder is further configured to restore the logical blocks transferred to the system interface.

* * * * *

UNITED STATES PATENT AND TRADEMARK OFFICE
CERTIFICATE OF CORRECTION

PATENT NO. : 10,838,806 B2
APPLICATION NO. : 15/955566
DATED : November 17, 2020
INVENTOR(S) : Lin et al.

Page 1 of 1

It is certified that error appears in the above-identified patent and that said Letters Patent is hereby corrected as shown below:

In the Claims

Column 12
Claim 1: Line 61: Delete "block" and insert --the block--

Signed and Sealed this
Twenty-second Day of December, 2020

Andrei Iancu
*Director of the United States Patent and Trademark Office*